United States Patent
Yang et al.

(10) Patent No.: US 11,289,141 B2
(45) Date of Patent: Mar. 29, 2022

(54) INTEGRATED CIRCUIT WITH ASYMMETRIC ARRANGEMENTS OF MEMORY ARRAYS

(71) Applicants: TAIWAN SEMICONDUCTOR MANUFACTURING CO., LTD., Hsinchu (TW); TSMC CHINA COMPANY LIMITED, Shanghai (CN)

(72) Inventors: Xiu-Li Yang, Shanghai (CN); He-Zhou Wan, Shanghai (CN); Kuan Cheng, Shanghai (CN); Ching-Wei Wu, Nantou County (TW)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 16/794,104

(22) Filed: Feb. 18, 2020

(65) Prior Publication Data
US 2021/0201972 A1    Jul. 1, 2021

(30) Foreign Application Priority Data
Dec. 31, 2019   (CN) .......................... 201911411056.5

(51) Int. Cl.
*G11C 8/00* (2006.01)
*G11C 8/10* (2006.01)
(Continued)

(52) U.S. Cl.
CPC .................. *G11C 8/10* (2013.01); *G11C 8/12* (2013.01); *G11C 8/14* (2013.01)

(58) Field of Classification Search
CPC ................ G11C 8/10; G11C 8/12; G11C 8/14
See application file for complete search history.

(56) References Cited

U.S. PATENT DOCUMENTS 5,088,065 A * 2/1992 Hanamura ............ G11C 11/419
                                                                365/189.05
5,818,784 A * 10/1998 Muranaka ............ G11C 7/1069
                                                                365/230.03
(Continued)

FOREIGN PATENT DOCUMENTS

KR    20080105867 A    12/2008
KR    20170113211 A    10/2017
(Continued)

*Primary Examiner* — Tuan T Nguyen
(74) *Attorney, Agent, or Firm* — Maschoff Brennan

(57) ABSTRACT

An integrated circuit includes a first array of memory cells, a second array of memory cells, a first pair of complementary data lines, a second pair of complementary data lines, and a third pair of complementary data lines. The first pair of complementary data lines extend along the first array of memory cells, and are coupled to the first array of memory cells. The second pair of complementary data lines extend along the second array of memory cells, and are coupled to the first pair of complementary data lines. The third pair of complementary data lines extend along the second array of memory cells, and are coupled to the second array of memory cells. A number of rows of memory cells in the first array of memory cells is different from a number of rows of memory cells in the second array of memory cells.

20 Claims, 7 Drawing Sheets

(51) Int. Cl.
  *G11C 8/12* (2006.01)
  *G11C 8/14* (2006.01)

(56) References Cited

U.S. PATENT DOCUMENTS

| | | | | |
|---|---|---|---|---|
| 5,875,141 A | * | 2/1999 | Shirley | G11C 7/06 |
| | | | | 365/207 |
| 5,966,315 A | | 10/1999 | Muller et al. | |
| 6,163,475 A | * | 12/2000 | Proebsting | G11C 7/065 |
| | | | | 257/E21.659 |
| 6,169,684 B1 | | 1/2001 | Takahashi et al. | |
| 6,760,242 B1 | * | 7/2004 | Park | G11C 15/00 |
| | | | | 365/203 |
| RE38,944 E | * | 1/2006 | Takahashi | G11C 7/10 |
| | | | | 365/230.03 |
| RE38,955 E | * | 1/2006 | Shirley | G11C 7/1006 |
| | | | | 365/190 |
| 9,916,875 B2 | * | 3/2018 | Liaw | G11C 5/14 |
| 2002/0001215 A1 | * | 1/2002 | Fujisawa | G11C 5/025 |
| | | | | 365/51 |
| 2002/0018359 A1 | | 2/2002 | Mizuno et al. | |
| 2002/0036943 A1 | * | 3/2002 | Fujimoto | G11C 11/419 |
| | | | | 365/230.03 |
| 2007/0183232 A1 | * | 8/2007 | Okada | G11C 7/12 |
| | | | | 365/201 |
| 2008/0031029 A1 | | 2/2008 | Liaw | |
| 2017/0256306 A1 | | 9/2017 | Liaw | |
| 2019/0214079 A1 | | 7/2019 | Disegni et al. | |

FOREIGN PATENT DOCUMENTS

| | | |
|---|---|---|
| KR | 20180138336 A | 12/2018 |
| KR | 20190142258 A | 12/2019 |

* cited by examiner

INTEGRATED CIRCUIT WITH ASYMMETRIC ARRANGEMENTS OF MEMORY ARRAYS

CROSS REFERENCE

The present application claims priority to China Application Serial Number 201911411056.5 filed on Dec. 31, 2019, which is herein incorporated by reference in its entirety.

BACKGROUND

Integrated circuits may have a succession of load devices connected commonly to a same signal line. The signal line includes a conductive path over which a signal propagates from a source, down the line to each load device. Thus, the configurations of the signal line and the load devices influence the speed of signal transmission in the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
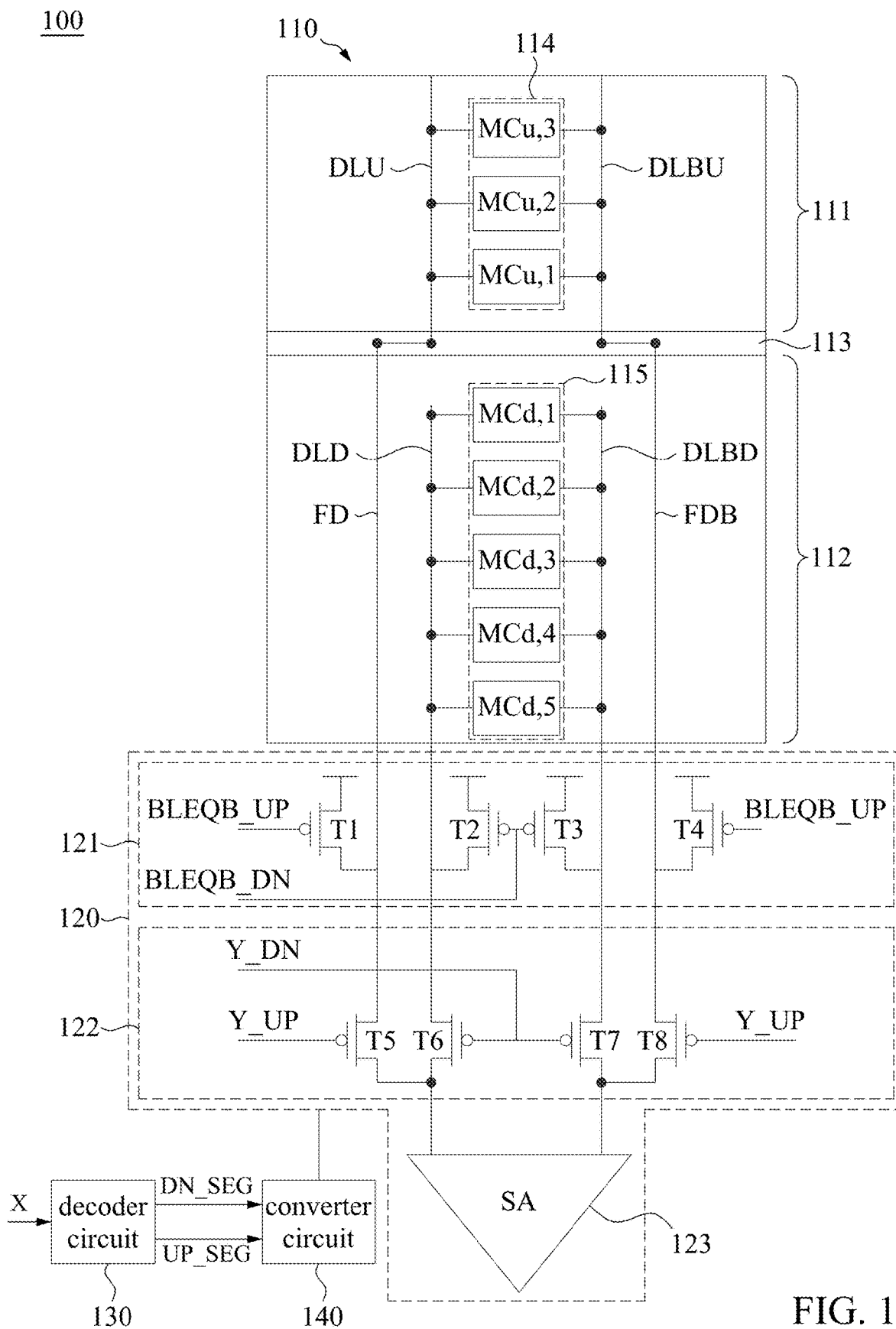
FIG. 1 is a schematic diagram of part of an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of part of an integrated circuit 100, in accordance with some embodiments of the present disclosure. For illustration, the integrated circuit 100 includes a memory bank 110, an access circuit 120, a decoder circuit 130, and a converter circuit 140. The memory bank 110 is coupled to the access circuit 120. The decoder circuit 130 is coupled to the access circuit 120 through the converter circuit 140.

The memory bank 110 includes segments 111-112, a strap cell 113, arrays of memory cells 114-115, pairs of complementary data lines DLU and DLBU, DLD and DLBD, and, FD and FDB. For illustration, the segment 111 and the segment 112 are separated from each other and arranged at opposite sides of the strap cell 113. In some embodiments, the array of memory cells 114 and the pair of complementary data lines DLU and DLBU are arranged in the segment 111. The array of memory cells 115 and the pair of complementary data lines DLD and DLBD are arranged in the segment 112. The pair of complementary data lines FD and FDB extend from the strap cell 113 and pass through the segment 112. The configurations of the elements of FIG. 1 will be discussed in detail in the following paragraphs.

The above implementation of the integrated circuit 100 is given for illustrative purposes. Various implementations of the integrated circuit 100 are within the contemplated scope of the present disclosure. For example, in some embodiments, the memory bank 110 includes a plurality of arrays of memory cells arranged in Y columns in the segment 111 and a plurality of arrays of memory cells in Y columns in the segment 112, in which the Y is an integer greater than one.

For illustration, the array of memory cells 114 include a plurality of memory cells MCu,1-MCu,3 arranged in rows and along a column direction. The array of memory cells 115 include a plurality of memory cells MCd,1-MCd,5 arranged in rows and along the column direction. In some embodiments, the array of the memory cells 114 includes M memory cells, in which M is, for example, 192, and the array of the memory cells 115 includes N memory cells, in which N is, for example, 320. Accordingly, in such embodiments, a total number of the array of memory cells 114 and the array of memory cells 115 is 512. A ratio of the array of memory cells 114 to the array of memory cells 115 is about 3/5.

As discussed above, in some embodiments, the number M of the array of memory cells 114 is different from the number N of the array of memory cells 115.

For example, the number M of the array of memory cells 114 is smaller than the number N of the array of memory cells 115. Alternatively stated, there are less memory cells arranged in the segment 111, compared with the memory cells arranged in segment 112. Accordingly, in various embodiments, the array of memory cells 115 occupy a greater area than that occupied by the array of memory cells 114 in a plan view or in a layout view.

Furthermore, in some embodiments, the array of memory cells 114 and the array of memory cell 115 are arranged according to a predetermined ratio of the number M of the array of memory cells 114 to the number N of the array of memory cells 115. In various embodiments, the predetermined ratio is less than 1. For example, the predetermined ratio of M to N is substantially 1/3, 3/5, 7/9, 5/11 or 3/13. The above implementation of the integrated circuit 100 is given for illustrative purposes. Various implementations of the integrated circuit 100 are within the contemplated scope of the present disclosure. For example, in some embodiments, the predetermined ratio of M to N is substantially 3.5:4.5. Those skilled in the art may determine, according to actual implementations of the present disclosure, a ratio of a number of the array of memory cells in the segment 111 to a number of the array of memory cells in the segment 112.

As shown in FIG. 1, the memory cells in the array of memory cells 114 are arranged in rows and each memory cell of the array of memory cells 114 is in a single row. Similarly, each memory cell of the array of memory cells 115 is arranged in a single row. Accordingly, the number M of the array of memory cells 114 is also referred to as a number of rows of memory cells in the array of memory cells 114, and the number N of the array of memory cells 115 is also referred to as a number of rows of memory cells in the array of memory cells 115, in the following paragraphs.

Based on the above, in various embodiments, the integrated circuit 100 includes, in Y columns, multiple arrays of memory cells 114 and multiple arrays of memory cells 115. For illustration, one of the multiple arrays of memory cells 114 is arranged with one of the multiple arrays of memory cells 115 in one column of the Y columns. Memory cells in the multiple arrays of memory cells 114 in each row are coupled to a corresponding word line (e.g., a word line WL of FIG. 3A), and are activated by the corresponding word line. Similarly, memory cells in the multiple arrays of memory cells 115 in each row are coupled to another corresponding word line, and are activated by the another corresponding word line. Based on the discussion above, the number M is also referred to as a number of rows of memory cells disposed in the segment 111, and the number N is also referred to as a number of rows of memory cells disposed in the segment 112.

With continuous reference to FIG. 1, for illustration, the pair of complementary data lines DLU and DLBU extend along the array of memory cells 114 and terminate between the array of memory cells 114 and the array of memory cells 115. In some embodiments, the pair of complementary data lines DLU and DLBU are disposed in a metal layer including, for example, a metal zero layer of a back-end-of-line (BEOL) interconnect structure, of an integrated circuit. The pair of complementary data lines DLU and DLBU are coupled to the array of memory cells 114. In some embodiments, the pair of complementary data lines DLU and DLBU are complementary bit lines for facilitating reading from and/or writing to accessed memory cells in the array of memory cells 114.

The pair of complementary data lines DLD and DLBD extend along the array of memory cells 115. In some embodiments, the pair of complementary data lines DLD and DLBD are disposed in the metal layer including, for example, the metal zero layer of a back-end-of-line (BEOL) interconnect structure, of the integrated circuit. The pair of complementary data lines DLD and DLBD are coupled to the array of memory cells 115. In some embodiments, the pair of complementary data lines DLD and DLBD are complementary bit lines for facilitating reading from and/or writing to accessed memory cells in the array of memory cells 115.

In some embodiments, with the arrangements as discussed above, the pair of complementary data lines DLU and DLBU and the pair of complementary data lines DLD and DLBD are electrically isolated. Accordingly, the array of memory cells 114 and the array of memory cells 115 are electrically isolated.

For illustration, as shown in FIG. 1, the pair of complementary data lines FD and FDB extend along the array of memory cells 115 and are electrically isolated with the array of memory cells 115. In some embodiments, the pair of complementary data lines FD and FDB are disposed in another metal layer including, for example, a metal two layer of a back-end-of-line (BEOL) interconnect structure, of the integrated circuit. Through elements in the strap cell 113, including, for example, vias and/or conductive segments, the pair of complementary data lines FD and FDB are coupled to the pair of complementary data lines DLD and DLBD. In various embodiments, the pair of complementary data lines FD and FDB are complementary bit lines for cooperating with the pair of complementary data lines DLD and DLBD to access data in the array of memory cells 114.

With reference of FIG. 1, as discussed above, because there are less memory cells in the array of memory cells 114, compared with the array of memory cells 115, the pair of complementary data lines DLU and DLBU coupled to the array of memory cells 114 are coupled to less memory cells, compared with the pair of complementary data lines DLD and DLBD coupled to the array of memory cells 115. Accordingly, in some embodiments, required lengths of the pair of complementary data lines DLU and DLBU are different from required lengths of the pair of complementary data lines DLD and DLBD. In various embodiments, the lengths of the pair of complementary data lines DLU and DLBU are smaller than the lengths of the pair of complementary data lines DLD and DLBD.

In addition, since the pair of complementary data lines FD and FDB extend from the strap cell 113, along the array of memory cells 115 and throughout the segment 112, lengths of complementary data lines FD and FDB are different from the length of the pair of complementary data lines DLU and DLBU. In some embodiments, the lengths of complementary data lines FD and FDB are longer than the lengths of the pair of complementary data lines DLU and DLBU. In various embodiments, the lengths of complementary data lines FD and FDB are even longer than the lengths of the pair of complementary data lines DLD and DLBD.

In a RAM device, the RC delay of data lines and the active power of the data lines depend on, for example, lengths of the data lines and the number of memory cells coupled thereto. Shorter data lines and fewer coupled memory cells can reduce the RC delay of the RAM device, thereby increasing the memory operation speed. However, in some approaches, equal numbers of memory cells are arranged in a first segment and in a second segment. A first pair of data lines are coupled to the memory cells in the first segment and a second pair of data lines extending along the memory cells in the second segment. A third pair of data lines are coupled to the memory cells in the second segment. In addition, the first pair of data lines and the third pair of data lines have approximately the same lengths. Accordingly, in such arrangements, even the first pair of data lines and the third pair of data lines have the same RC load contributed by the same lengths of the first pair of data lines and the third pair of data lines, and a total RC load contributed by the memory cells in the first segment to the first pair of data lines and a total RC load contributed by the memory cells in the second segment to the third pair of data lines are approximately the same. However, the first pair of data lines suffer relatively higher load induced by longer transmission path (including, for example, a sum of lengths of the first pair of data lines and the second pair of data lines coupled thereto), compared to the third pair of data lines. Therefore, due to unbalance loads of the first pair of data lines and the third pair of data lines, the RAM device experiences unbalance access speeds and the active powers during read/write operation with the memory cells in the first segment and with the memory cells in the second segment.

Compared to the above approaches, with configurations as discussed above in the embodiments of FIG. 1, the pair of complementary data lines DLU and DLBU have a reduced RC load contributed by the shorter lengths thereof and smaller number of array of memory cells 114 coupled thereto, compared to the pair of complementary data lines DLD and DLBD. Conversely, the pair of complementary data lines DLD and DLBD have an increased RC load contributed by the longer lengths thereof and greater number of array of memory cells 115 coupled thereto, compared to the pair of complementary data lines DLU and DLBU. In such embodiments, the difference of RC loads between the pair of complementary data lines DLU and DLBU along with the pair of complementary data lines FD and FDB, and the pair of complementary data lines DLD and DLBD, is reduced. Alternatively stated, the RC loads of the pair of complementary data lines DLU and DLBU along with the pair of complementary data lines FD and FDB and the pair of complementary data lines DLD and DLBD are more balanced. Moreover, RC loads are associated with RC delay effects which result in the signal delay when signals propagate in data lines. Therefore, due to the balanced RC loads, a total RC delay of the pair of complementary data lines DLU and DLBU and the pair of complementary data lines FD and FDB is more balanced with or substantially the same with the RC delay of the pair of complementary data lines DLD and DLBD, in some embodiments. Accordingly, the integrated circuit 100 provides balanced access speeds and the active powers during read/write operation with the array of memory cells 114 and the array of memory cells 115.

As stated above, with asymmetric configurations of the complementary data lines and the memory cells coupled thereto, the balance loads result in balanced access speeds and the active powers during read/write operation. Alternatively stated, any suitable ratio of the number of rows of memory cells in the array of memory cells 114 to the number of rows of memory cells in the array of memory cells 115, for obtaining the balanced loads, is applicable. In order to obtain the balanced loads, the ratio of the number of rows of memory cells in the array of memory cells 114 to the number of rows of memory cells in the array of memory cells 115 is determined by various factors including, for example, the manufacturing processes of memory cells, the features of the memory cells, the layout design of the integrated circuit, materials, or any factors considered in manufacturing integrated circuits. Accordingly, those skilled in the art may also determine, according to actual implementations of the present disclosure, a ratio of the number of rows of memory cells in the segment 111 to a number of rows of memory cells in the segment 112.

As shown in FIG. 1, the access circuit 120 includes a precharge circuit 121, a selector circuit 122, and a sense amplifier 123. The precharge circuit 121 is coupled to the selector circuit 122. The selector circuit 122 is coupled between the precharge circuit 121 and the sense amplifier 123. In some embodiments, the access circuit 120 operates for a read operation of the memory bank 110.

For illustration, the precharge circuit 121 includes transistors T1-T4. First terminals of the transistor T1-T4 are coupled to a voltage supply. A second terminal of the transistor T1 is coupled to the complementary data line FD. A control terminal of the transistor T1 is configured to receive a charge signal BLEQB_UP. A second terminal of the transistor T2 is coupled to the complementary data line DLD. A second terminal of the transistor T3 is coupled to the complementary data line DLBD. Control terminals of the transistor T2 and the transistor T3 are configured to receive a charge signal BLEQB_DN. A second terminal of the transistor T4 is coupled to the complementary data line FBD. A control terminal of the transistor T4 is configured to receive a charge signal BLEQB_UP. In some embodiments, during a read operation, the precharge circuit 121 precharges, in response to the charge signals BLEQB_UP and BLEQB_DN, the pair of complementary data lines DLU and DLBU and the pair of complementary data lines FD and FDB, or the pair of complementary data lines DLD and DLBD.

The selector circuit 122 includes transistors T5-T8. A first terminal of the transistor T5 is coupled to the complementary data line FD. A second terminal of the transistor T5 is coupled to a first input of the sense amplifier 123. A control terminal of the transistor T5 is configured to receive a select signal Y_UP. A first terminal of the transistor T6 is coupled to the complementary data line DLD. A second terminal of the transistor T6 is coupled to the first input of the sense amplifier 123. A control terminal of the transistor T6 is configured to receive a select signal Y_DN. A first terminal of the transistor T7 is coupled to the complementary data line DLBD. A second terminal of the transistor T7 is coupled to a second input of the sense amplifier 123. A control terminal of the transistor T7 is configured to receive the select signal Y_DN. A first terminal of the transistor T8 is coupled to the complementary data line FDB. A second terminal of the transistor T8 is coupled to the second input of the sense amplifier 123. A control terminal of the transistor T8 is configured to receive the select signal Y_UP. In some embodiments, the selector circuit 122 selectively passes, in response to the select signals Y_DN and Y_UP, signals from the pair of complementary data lines DLU and DLBU through the pair complementary data lines FD and FDB to the sense amplifier 123, or signals from the pair of complementary data lines DLD and DLBD to the sense amplifier 123. In various embodiments, the selector circuit 122 selects, in response to the select signals Y_DN and Y_UP, the array of memory cells 114 or the array of memory cells 115 to be coupled to the sense amplifier 123.

In some embodiments, the transistors T1-T8 are P-type field-effect transistors. However, the present disclosure is not limited thereto. Other suitable arrangements of the transistors T1-T8 are within the contemplated scope of the present disclosure. For example, in some embodiments, the transistors T1-T8 are other kinds of transistors except the field-effect transistors.

The sense amplifier 123 is configured to detect and amplify a voltage difference between the pair of complementary data lines DLU and DLBU during a read operation, or a voltage difference between the pair of complementary data lines DLD and DLBD during a read operation. Some details regarding the sense amplifier 123 and performing a read operation using sense amplifier 123 are omitted in this disclosure.

The decoder circuit 130 is configured to generate control signals UP_SEG and DN_SEG based on a signal X having a word line address. Moreover, in some embodiments, the decoder circuit 130 outputs the control signals UP_SEG and DN_SEG for further enabling the access circuit 120 to sense data stored in the array of memory cells 114, or data stored in the array of memory cells 115. For example, in some embodiments, when the control signal UP_SEG has a high logic state and the control signal DN_SEG has a low logic state, the access circuit 120 is enabled to sense the data stored in the array of memory cells 114. Conversely, when the control signal UP_SEG has the low logic state and the control signal DN_SEG has the high logic state, the access circuit 120 is enabled to sense the data stored in the array of memory cells 115. The above implementation of the decoder circuit 130 is given for illustrative purposes. Various implementations of the decoder circuit 130 are within the contemplated scope of the present disclosure. For example, in various embodiments, when the control signal UP_SEG has a low logic state and the control signal DN_SEG has a high logic state, the access circuit 120 is enabled to sense the data stored in the array of memory cells 114. Conversely, when the control signal UP_SEG has the high logic state and the control signal DN_SEG has the low logic state, the access circuit 120 is enabled to sense the data stored in the array of memory cells 115. The detailed configuration of generating the control signals UP_SEG and DN_SEG will be discussed with some embodiments in the following paragraphs.

In some embodiments, the decoder circuit 130 outputs the control signals UP_SEG and DN_SEG to the converter circuit 140 for generating the charge signals BLEQB_UP and BLEQB_DN, and the select signals Y_UP and Y_DN.

The detailed configuration of the converter circuit 140 will be discussed in the following paragraphs.

Figure 2:
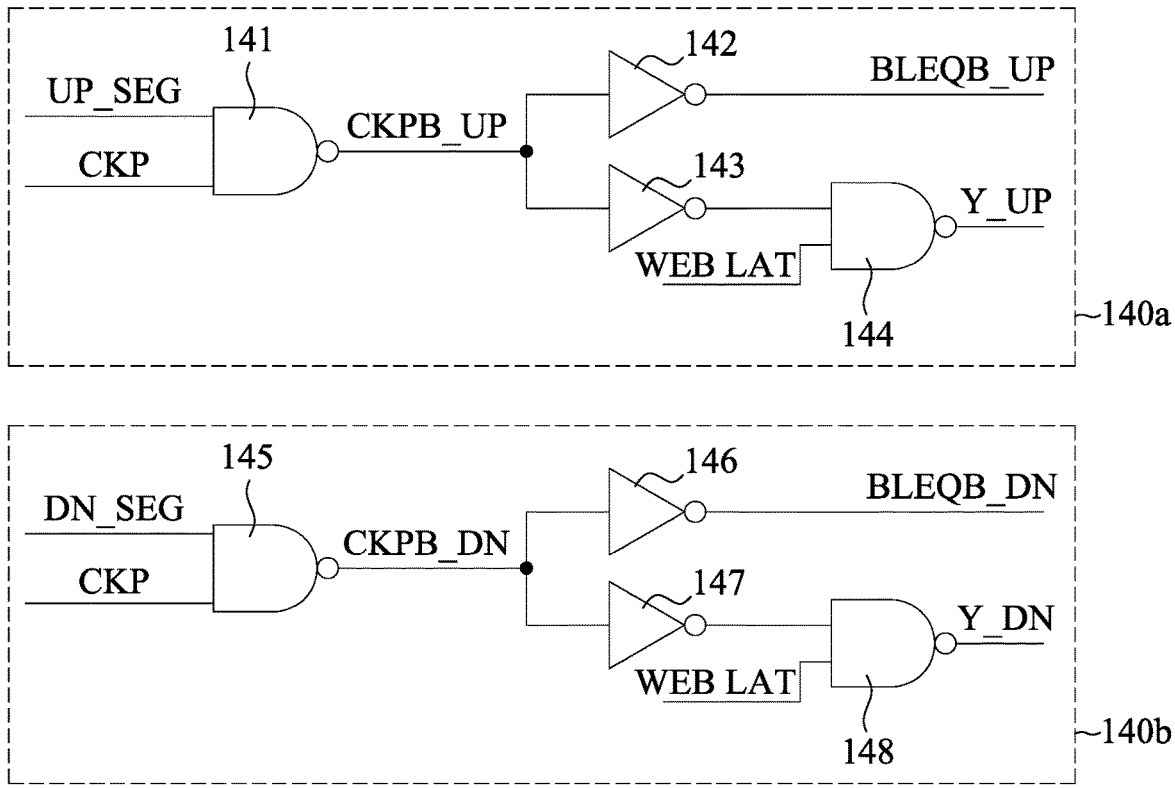
FIG. 2 is a schematic diagram of a converter circuit of the integrated circuit of FIG. 1, in accordance with some embodiments of the present disclosure.

Reference is now made to FIG. 2. FIG. 2 is a schematic diagram of the converter circuit 140 of the integrated circuit 100 of FIG. 1, in accordance with some embodiments of the present disclosure. For illustration, the converter circuit 140 includes converting logic circuits 140a-140b. The converting logic circuit 140a is configured to receive the control signal UP_SEG from the decoder circuit 130 and a clock signal CKP to generate, in response to a latch signal WEB_LAT, the charge signal BLEQB_UP and the select signal Y_UP. Similarly, the converting logic circuit 140b is configured to receive the control signal DN_SEG from the decoder circuit 130 and the clock signal CKP to generate, in response to the latch signal WEB_LAT, the charge signal BLEQB_DN and the select signal Y_DN.

For illustration, the converting logic circuit 140a includes a NAND gate 141, inverters 142-143, and a NAND gate 144. An output of the NAND gate 141 is coupled to inputs of the inverters 142-143. An output of the inverter 143 is coupled to one of inputs of the NAND gate 144. In some embodiments, the NAND gate 141 receives the control signal UP_SEG and the clock signal CKP at inputs thereof, and outputs a signal CKPB_UP at the output thereof. The inverter 142 inverts the signal CKPB_UP received from the NAND gate 141 to generate the charge signal BLEQB_UP. The inverter 143 inverts the signal CKPB_UP received from the NAND gate 141 to output an inverted signal CKPB_UP to the input of the NAND gate 144. The NAND gate 144 received the inverted signal CKPB_UP and the latch signal WEB_LAT, and generates the select signal Y_UP.

Similarly, the converting logic circuit 140b includes a NAND gate 145, inverters 146-147, and a NAND gate 148. An output of the NAND gate 145 is coupled to inputs of the inverters 146-147. An output of the inverter 147 is coupled to one of inputs of the NAND gate 148. In some embodiments, the NAND gate 145 receives the control signal DN_SEG and the clock signal CKP at inputs thereof, and outputs a signal CKPB_DN at the output thereof. The inverter 146 inverts the signal CKPB_DN received from the NAND gate 145 to generate the charge signal BLEQB_DN. The inverter 143 inverts the signal CKPB_DN received from the NAND gate 145 to output an inverted signal CKPB_DN to the input of the NAND gate 148. The NAND gate 148 receives the inverted signal CKPB_DN and the latch signal WEB_LAT, and generates the select signal Y_DN.

With reference of FIGS. 1 and 2, in some embodiments, during a read operation, when the clock signal has a logic value of 0 and the control signal UP_SEG has a logic value of 1, the NAND gate 141 outputs the signal CKPB_UP having a logic value of 1. The inverter 142 inverts the signal CKPB_UP and generates the charge signal BLEQB_UP having a logic value of 0. Accordingly, the transistors T1 and T4 are turned on, in response to the charge signal BLEQB_UP, to precharge the pair of complementary bit lines DLU, DLBU, FD, and FDB. Further, the inverter 143 inverts the signal CKPB_UP and output the inverted CKPB_UP having a logic value of 0. The NAND gate 144 receives the inverted CKPB_UP and the latch signal WEB_LAT having a logic 1, and generates the select signal Y_UP having a logic value of 1.

With continued reference to FIGS. 1 and 2, after precharging the pair of complementary bit lines DLU, DLBU, FD, and FDB, when the clock signal has a logic value of 1 and the control signal UP_SEG has the logic value of 1, the NAND gate 141 outputs the signal CKPB_UP having a logic value of 0. The inverter 142 inverts the signal CKPB_UP and generates the charge signal BLEQB_UP having a logic value of 1. The inverter 143 inverts the signal CKPB_UP and output the inverted CKPB_UP having a logic value of 1. The NAND gate 144 receives the inverted CKPB_UP and the latch signal WEB_LAT having a logic 1, and generates the select signal Y_UP having a logic value of 0. Accordingly, the transistors T5 and T8 are turned on, in response to the select signal Y_UP, to couple the pair of complementary bit lines DLU, DLBU, FD, and FDB to the sense amplifier 123. Alternatively stated, the data stored in the array of memory cells 114 are accessed by the sense amplifier 123.

In other embodiments, during the read operation, when the clock signal has a logic value of 0 and the control signal DN_SEG has a logic value of 1, the NAND gate 145 outputs the signal CKPB_DN having a logic value of 1. The inverter 146 inverts the signal CKPB_DN and generates the charge signal BLEQB_DN having a logic value of 0. Accordingly, the transistors T2 and T3 are turned on, in response to the charge signal BLEQB_DN, to precharge the pair of complementary bit lines DLD, and DLBD. Further, the inverter 147 inverts the signal CKPB_DN and output the inverted CKPB_DN having a logic value of 0. The NAND gate 148 receives the inverted CKPB_UP and the latch signal WEB_LAT having a logic 1, and generates the select signal Y_DN having a logic value of 1.

After precharging the pair of complementary bit lines DLD, and DLBD, when the clock signal has a logic value of 1 and the control signal DN_SEG has the logic value of 1, the NAND gate 145 outputs the signal CKPB_DN having a logic value of 0. The inverter 146 inverts the signal CKPB_DN and generates the charge signal BLEQB_DN having a logic value of 1. The inverter 147 inverts the signal CKPB_DN and output the inverted CKPB_DN having a logic value of 1. The NAND gate 148 receives the inverted CKPB_DN and the latch signal WEB_LAT having a logic 1, and generates the select signal Y_DN having a logic value of 0. Accordingly, the transistors T6 and T7 are turned on, in response to the select signal Y_DN, to couple the pair of complementary bit lines DLD, and DLBD to the sense amplifier 123. Alternatively stated, the data stored in the array of memory cells 115 are accessed by the sense amplifier 123.

The configurations of FIGS. 1 and 2 are given for illustrative purposes. Various configurations of the elements mentioned above in FIGS. 1 and 2 are within the contemplated scope of the present disclosure. For example, in various embodiments, the access circuit 120, the decoder circuit 130, and the converter circuit cooperate together with other elements (not shown) of the integrated circuit 100 in a write operation.

Figure 3A:
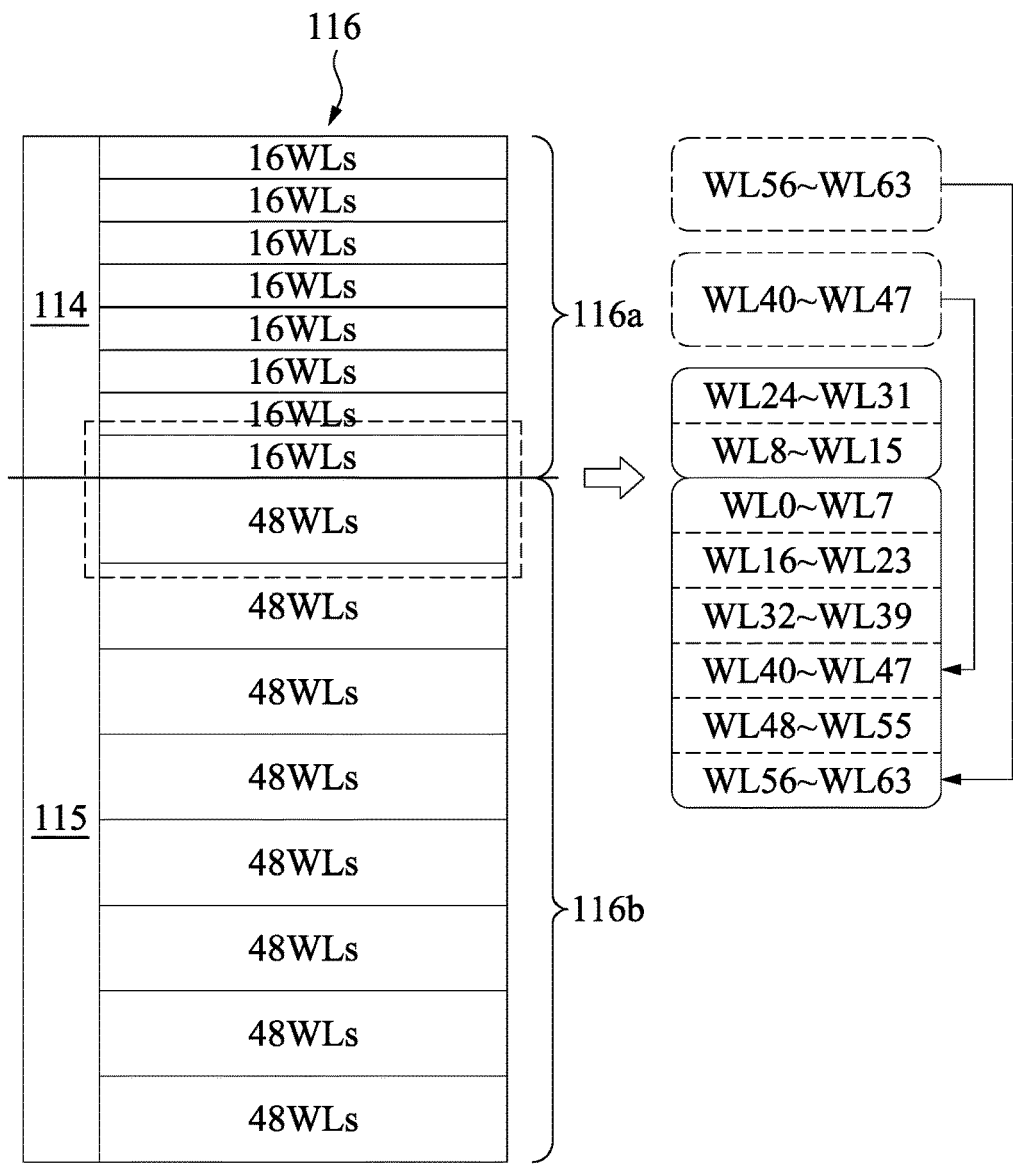
FIG. 3A is a schematic diagram of word lines of the integrated circuit of FIG. 1, in accordance with some embodiments of the present disclosure.

Reference is now made to FIGS. 1 and 3A. FIG. 3A is a schematic diagram of word lines 116 of the integrated circuit 100 of FIG. 1, in accordance with some embodiments of the present disclosure. As shown in FIG. 3A, the integrated circuit 100 further includes multiple word lines 116. The word lines 116 include a first group of word lines 116a and a second group of word lines 116b. In some embodiments, the first group of word lines 116a are disposed in the segment 111 of FIG. 1, and the second group of word lines 116b are disposed between the segment 111 and the sense amplifier 123 of FIG. 1.

Furthermore, in some embodiments, as shown in FIG. 3A, the first group of word lines 116a are coupled to the array of memory cells 114 (which also collectively indicate the multiple arrays of memory cells in the segment 111, as discussed above) of FIG. 1, and the second group of word lines 116b are coupled to the array of memory cells 115 (which also collectively indicate the multiple arrays of memory cells in the segment 112, as discussed above) of FIG. 1. For operation, each one of the first group of word lines 116a is configured to be activated, according to the word line address as mentioned above, to turn on a corresponding memory cell of the array of memory cells 114 for a write or read operation. Similarly, each one of the second group of word lines 116b is configured to be activated, according to the word line address, to turn on a corresponding memory cell of the array of memory cells 115 for a write or read operation. In various embodiments, when the integrated circuit 100 includes Y columns of memory cells as discussed above, each one of the first group of word lines 116a is activated to turn on a corresponding row of memory cells of the array of memory cells 114, and each one of the first group of word lines 116b is activated to turn on a corresponding row of memory cells of the array of memory cells 115. The detailed configurations of the word line address will be discussed in the following paragraphs.

For illustration, in the embodiments of FIG. 3A, the first group of word lines 116a and the second group of word lines 116b are arranged according to a predetermined ratio that is about 1/3. In some embodiments, the first group of word lines 116a include, for example, 128 word lines, and the second group of word lines 116b include, for example, 368 word lines. Alternatively stated, a number of the first group of word lines 116a is smaller than a number of second group of word lines 116b.

As shown at the left FIG. 3A, the first group of word lines 116a include multiple first subgroups, and the second group of word lines 116b include multiple second subgroups. In some embodiments, each one of the first subgroup includes, for example, 16 word lines, and each one of the second subgroup includes, for example, 48 word lines.

In some embodiments, the order of the word lines 116 is embodied by a word line scramble policy. For example, in a portion of the word lines 116 circled by dash line as shown at the left of FIG. 3A, 64 word lines included in one subgroup of the first subgroups and in an adjacent one of the second subgroups are taken as example for illustration at the right of FIG. 3A. For illustration, as shown at the right of FIG. 3A, word lines WL0-WL39 are arranged in a regular alternate order. Specifically, the word lines WL0-WL7 are arranged in a first subset of the second subgroup. The word lines WL8-WL15 are arranged in a first subset of the first subgroup. The word lines WL16-WL23 are arranged in a second subset below a second subset of the second subgroup. The word lines WL24-WL31 are arranged in a second subset of the first subgroup. The word lines WL32-WL39 are arranged in a third subset of the second subgroup. Further, instead of following the regular alternate order to arrange word lines WL40-WL47 in a third subset of the first subgroup, the word lines WL40-WL47 are arranged in a fourth subset of the second subgroup. Continuously following the regular alternate order, word lines WL48-WL55 are arranged in a fifth subset of the second subgroup. Instead of following the regular alternate order to arrange word lines WL56-WL63 in a third subset of the first subgroup, the word lines WL56-WL63 are arranged in a sixth subset of the second subgroup.

In addition, the rest word lines in the first groups of word lines 116a and in the second groups of word lines 116b at the left of FIG. 3A are arranged with the same word line scramble policy. Therefore, the repetitious descriptions are omitted here.

In some embodiments, the word lines 116 are configured to be activated according to the word line address. For example, in response to the word line address having 000000000, the word line WL0 is activated, and further a corresponding memory cell coupled to the word line WL0 is turned on for a read or write operation.

Figure 3B:
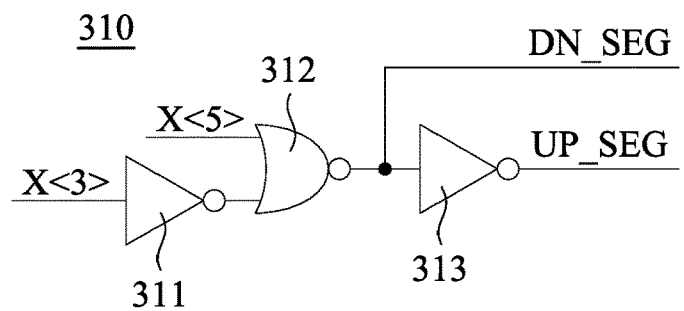
FIG. 3B is a circuit diagram of a decoder circuit corresponding to the decoder circuit of FIG. 1, in accordance with some embodiments of the present disclosure.

Reference is now made to FIG. 3B. FIG. 3B is a circuit diagram of a decoder circuit 310 corresponding to the decoder circuit 130 of FIG. 1, in accordance with some embodiments of the present disclosure. In some embodiments, the decoder circuit 310 is configured with respect to, for example, the decoder circuit 130 of FIG. 1. For illustration, the decoder circuit 310 includes an inverter 311, an OR gate 312 and an inverter 313. An output of the inverter 311 is coupled to an input of the OR gate 312. An output of the OR gate 312 is coupled to an input of the inverter 313.

The inverter 311 and the OR gate 312 are configured to receive the signal X with the aforementioned word line address including, for example, 000000000, and configured to perform logic operations of bit data of the word line address, including, for example, bit X<3> and bit X<5>, of the signal X. The inverter 311 is configured to invert bit X<3>. The OR gate 312 is configured to perform the NOR operation with an inverted bit X<3> and the bit X<5> and to output a signal as the control signal DN_SEG. The inverter 313 is configured to invert the signal received from the OR gate 312 and to output a signal as the control signal UP_SEG. Alternatively stated, the control signals DN_SEG and UP_SEG are associated with the word line address.

Reference is now made to FIGS. 3A and 3B. In some embodiments, the bit X<3> has a value of 0 and the bit X<5> has a value of 0, one of the word lines WL0-WL7 and WL16-WL23 is activated to turn on a corresponding memory cell on the array of memory cells 115 of FIG. 1. Further, the decoder circuit 310 generates the control signal DN_SEG having a value of 1 and the control signal UP_SEG having a value of 0, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLD and DLBD, and senses the data stored in the array of memory cells 115.

Similarly, when the bit X<3> has a value of 0 and the bit X<5> has a value of 1, one of the word lines WL32-WL39 and WL48-WL55 is activated to turn on a corresponding memory cell on the array of memory cells 115 of FIG. 1. The operations of the decoder circuit 310, the converter circuit 140, and the access circuit 120 are similar with the operations illustrated in the embodiments of the bit X<3> having a value of 0 and the bit X<5> having a value of 0, and the repetitious descriptions are thus not given here.

Furthermore, in various embodiments, when the bit X<3> has a value of 1 and the bit X<5> has a value of 0, one of the word lines WL8-WL15 and WL24-WL31 is activated to turn on a corresponding memory cell on the array of memory cells 114 of FIG. 1. Further, the decoder circuit 310 generates the control signal DN_SEG having a value of 0 and the control signal UP_SEG having a value of 1, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLU, DLBU, FD, and FBD, and senses the data stored in the array of memory cells 114.

When the bit X<3> has a value of 1 and the bit X<5> has a value of 1, one of the word lines WL40-WL47 and WL56-WL63 is activated to turn on a corresponding memory cell on the array of memory cells 115 of FIG. 1. The operations of the decoder circuit 310, the converter circuit 140, and the access circuit 120 are similar with the operations illustrated in the embodiments of the bit X<3> having a value of 0 and the bit X<5> having a value of 1, and the repetitious descriptions are thus not given here.

In addition, the operations of the rest word lines, according to the word line address, in the word lines 116 at the left of FIG. 3A are similar with the operations of the word lines circled by the dash line in the word lines 116. Therefore, the repetitious descriptions are omitted here.

Based on the above discussion with respect to FIGS. 3A-3B, in some embodiments, the predetermined ratio of the numbers of word lines or of the numbers of rows of memory cells in arrays of memory cells results in the arrangements of the word lines, and further determines the configurations of the decoder circuit 310.

The implements of FIGS. 3A-3B are given for illustrative purposes. Various implementations of the word lines 116 and the decoder circuit 310 are within the contemplated scope of the present disclosure. For example, in various embodiments, two word lines are arranged in subsets of the first subgroups and the second subgroups. Moreover, in some embodiments, the word lines are arranged with a reversed regular alternate order. Specifically, the word lines are firstly arranged in the first subgroup, instead of in the second subgroup. In such embodiments, the configurations of the decoder circuit 310 are accordingly adjusted to generate the corresponding control signals DN_SEG and UP_SEG.

Figure 4A:
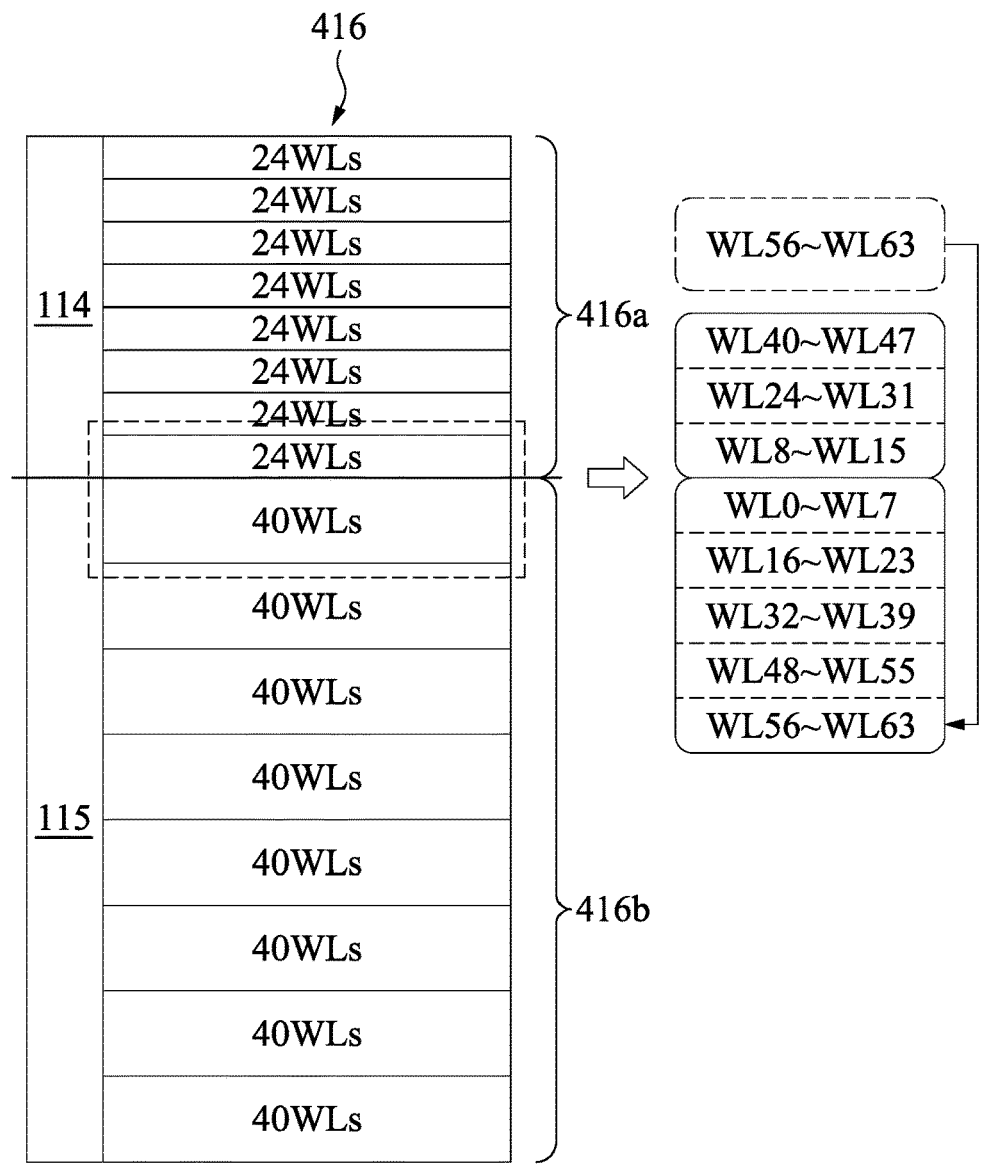
FIG. 4A is a schematic diagram of word lines of the integrated circuit of FIG. 1, in accordance with another embodiment of the present disclosure.

Reference is now made to FIG. 4A. FIG. 4A is a schematic diagram of word lines 416 of the integrated circuit 100 of FIG. 1, in accordance with another embodiment of the present disclosure.

Compared with the configurations of FIG. 3A, instead of including the word lines 116, as shown at the left of FIG. 4A, the integrated circuit 100 further includes multiple word lines 416. The word lines 416 include a first group of word lines 416a and a second group of word lines 416b. In some embodiments, the first group of word lines 416a are disposed in the segment 111 of FIG. 1, and the second group of word lines 416b are disposed between the segment 111 and the sense amplifier 123 of FIG. 1.

In some embodiments, the first group of word lines 416a are coupled to the array of memory cells 114 of FIG. 1, and the second group of word lines 416b are coupled to the array of memory cells 115 of FIG. 1. The operations of the first group of word lines 416a and the second group of word lines 416b are similar with the first group of word lines 116a and the second group of word lines 116b of FIG. 3A, and the repetitious descriptions are thus not given here.

For illustration, in the embodiments at the left of FIG. 4A, the first group of word lines 416a and the second group of word lines 416b are arranged according to a predetermined ratio that is about 3/5. In some embodiments, the first group of word lines 416a include, for example, 192 word lines, and the second group of word lines 416b include, for example, 320 word lines. Alternatively stated, a number of the first group of word lines 416a is smaller than a number of second group of word lines 416b.

As shown at the left of FIG. 4A, the first group of word lines 416a include multiple first subgroups, and the second group of word lines 416b include multiple second subgroups. In some embodiments, each one of the first subgroup includes, for example, 24 word lines, and each one of the second subgroup includes, for example, 40 word lines.

In some embodiments, the order of the word lines 416 is embodied by a word line scramble policy. For example, in a portion of the word lines 416 circled by dash line as shown at the left of FIG. 4A, 64 word lines included in one subgroup of the first subgroups and in an adjacent one of the second subgroups are taken as example for illustration at the right of FIG. 4A. For illustration, as shown at the right of FIG. 4A, word lines WL0-WL55 are arranged in a regular alternate order. Specifically, the word lines WL0-WL7 are arranged in a first subset of the second subgroup. The word lines WL8-WL15 are arranged in a first subset of the first subgroup. The word lines WL16-WL23 are arranged in a second subset below a second subset of the second subgroup. The word lines WL24-WL31 are arranged in a second subset of the first subgroup. The word lines WL32-WL39 are arranged in a third subset of the second subgroup. The word lines WL40-WL47 are arranged in a third subset of the first subgroup. The WL48-WL55 are arranged in a fourth subset of the second subgroup. Further, instead of following the regular alternate order to arrange word lines WL56-WL63 in a fourth subset of the first subgroup, the word lines WL56-WL63 are arranged in a fifth subset of the second subgroup.

In addition, the rest word lines in the first groups of word lines 416a and in the second groups of word lines 416b at the left of FIG. 4A are arranged with the same word line scramble policy. Therefore, the repetitious descriptions are omitted here.

Figure 4B:
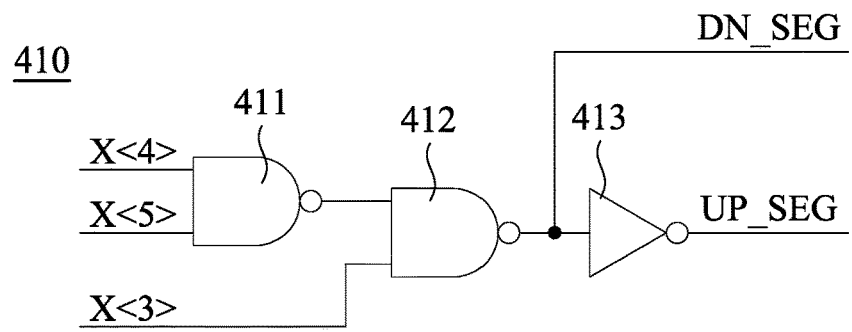
FIG. 4B is a circuit diagram of a decoder circuit corresponding to the decoder circuit of FIG. 1, in accordance with some embodiments of the present disclosure.

Reference is now made to FIG. 4B. FIG. 4B is a circuit diagram of a decoder circuit 410 corresponding to the decoder circuit 130 of FIG. 1, in accordance with some embodiments of the present disclosure. In some embodiments, the decoder circuit 410 is configured with respect to, for example, the decoder circuit 130 of FIG. 1. For illustration, the decoder circuit 410 includes NAND gates 411-412, and an inverter 413. An output of the NAND gate 411 is coupled to an input of the NAND gate 412. An output of the NAND gate 412 is coupled to an input of the inverter 413.

The NAND gates 411-412 are configured to receive the signal X with the aforementioned word line address including, for example, 000000000, and configured to perform logic operations of the bit data of the word line address, including, for example, the bit X<3>, bit X<4> and the bit X<5>, of the signal X. The NAND gate 411 is configured to perform a NAND operation with the bit X<4> and the bit X<5> in order to output a signal to the NAND gate 412. The NAND gate 412 is configured to perform a NAND operation with the bit X<3> and the signal received from the NAND gate 411 to output another signal as the control signal DN_SEG. The inverter 413 is configured to invert the signal received from the NAND gate 412 and output a signal as the control signal UP_SEG.

Reference is now made to FIGS. 4A and 4B. In some embodiments, when the bit X<3> has a value of 0 with the bit X<4> and the bit X<5> having a value of 0 or 1, one of the word lines WL0-WL7, WL16-WL23, WL32-WL39, and WL48-WL55 is activated to turn on a corresponding memory cell on the array of memory cells 115 of FIG. 1. Further, the decoder circuit 410 generates the control signal DN_SEG having a value of 1 and the control signal UP_SEG having a value of 0, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLD and DLBD, and senses the data stored in the array of memory cells 115.

Similarly, when the bit X<3>, the bit X<4>, and the bit X<5> have values of 1, one of the word lines WL56-WL63 is activated to turn on a corresponding memory cell on the array of memory cells 115 of FIG. 1. The operations of the decoder circuit 410, the converter circuit 140, and the access circuit 120 are similar with the operations illustrated in the embodiments of the bit X<3> having a value of 0 with the bit X<4> and the bit X<5> having value of a 0 or 1, and the repetitious descriptions are thus not given here.

In various embodiments, when the bit X<3> has a value of 1 and the bit X<5> has a value of 0 with the bit X<4> having a value of 0 or 1, one of the word lines WL8-WL15, and WL23-WL31 is activated to turn on a corresponding memory cell on the array of memory cells 114 of FIG. 1. Further, the decoder circuit 410 generates the control signal DN_SEG having a value of 0 and the control signal UP_SEG having a value of 1, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLU, DLBU, FD, and FBD, and senses the data stored in the array of memory cells 114.

Similarly, when the bit X<3> has a value of 1 and the bit X<4> has a value of 0 with the bit X<5> having a value of 0 or 1, one of the word lines WL40-WL47 is activated to turn on a corresponding memory cell on the array of memory cells 114 of FIG. 1. The operations of the decoder circuit 410, the converter circuit 140, and the access circuit 120 are similar with the operations illustrated in the embodiments of the bit X<3> having a value of 1 and the bit X<5> having a value of 0 with the bit X<4> having value of a 0 or 1, and the repetitious descriptions are thus not given here.

In addition, the operations of the rest word lines, according to the word line address, in the word lines 416 at the left of FIG. 4A are similar with the operations of the word lines circled by the dash line in the word lines 416. The repetitious descriptions are thus omitted here.

Based on the above discussion with respect to FIGS. 4A-4B, the determination of the configurations of the decoder circuit 410 is similar to that of the decoder circuit 310 as discussed above. Therefore, detailed descriptions are omitted for sake of brevity.

The implements of FIGS. 4A-4B are given for illustrative purposes. Various implementations of the word lines 416 and the decoder circuit 410 are within the contemplated scope of the present disclosure. For example, in some embodiments, four word lines are arranged in subsets of the first subgroups and the second subgroups, along with the adjustment to the configurations of decoder circuit 410.

Figure 5A:
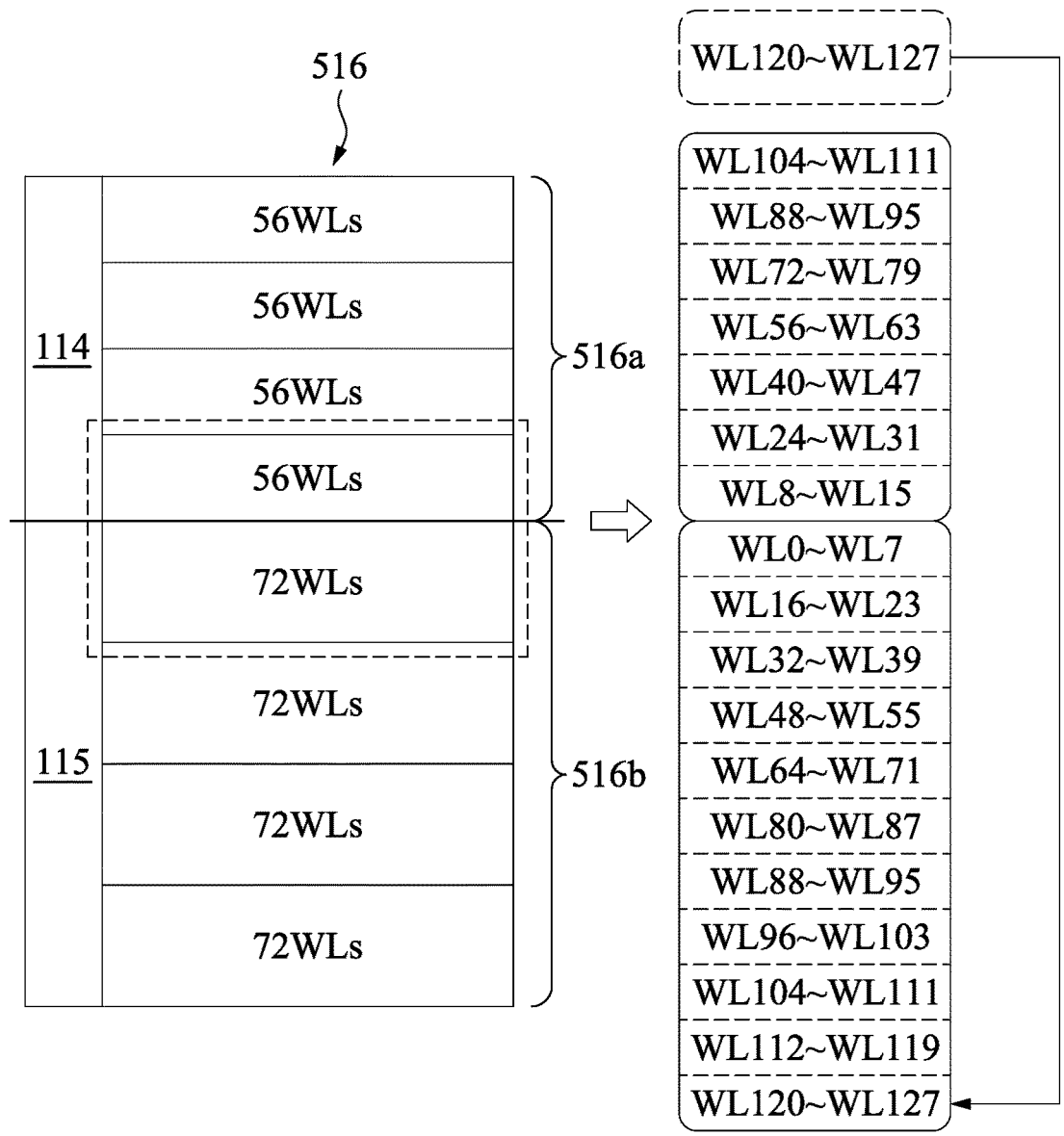
FIG. 5A is a schematic diagram of word lines of the integrated circuit of FIG. 1, in accordance with another embodiment of the present disclosure.

Reference is now made to FIG. 5A. FIG. 5A is a schematic diagram of word lines 516 of the integrated circuit 100 of FIG. 1, in accordance with another embodiment of the present disclosure.

Compared with the configurations of FIG. 4A, instead of including the word lines 416, as shown at the left of FIG. 5A, the integrated circuit 100 further includes multiple word lines 516. The word lines 516 include a first group of word lines 516a and a second group of word lines 516b. In some embodiments, the first group of word lines 516a are disposed in the segment 111 of FIG. 1, and the second group of word lines 516b are disposed between the segment 111 and the sense amplifier 123 of FIG. 1.

In some embodiments, the first group of word lines 516a are coupled to the array of memory cells 114 of FIG. 1, and the second group of word lines 516b are coupled to the array of memory cells 115 of FIG. 1. The operations of the first group of word lines 516a and the second group of word lines 516b are similar with the first group of word lines 416a and the second group of word lines 416b of FIG. 4A, and the repetitious descriptions are thus not given here.

For illustration, in the embodiments at the left of FIG. 5A, the first group of word lines 516a and the second group of word lines 516b are arranged according to a predetermined ratio that is about 7/9. In some embodiments, the first group of word lines 516a include, for example, 224 word lines, and the second group of word lines 516b include, for example, 288 word lines. Alternatively stated, a number of the first group of word lines 516a is smaller than a number of second group of word lines 516b.

As shown at the left of FIG. 5A, the first group of word lines 516a include multiple first subgroups, and the second group of word lines 516b include multiple second subgroups. In some embodiments, each one of the first subgroup includes, for example, 56 word lines, and each one of the second subgroup includes, for example, 72 word lines.

In some embodiments, the order of the word lines 516 is embodied by a word line scramble policy. For example, in a portion of the word lines 516 circled by dash line as shown at the left of FIG. 5A, 128 word lines included in one subgroup of the first subgroups and in an adjacent one of the second subgroups are taken as example for illustration at the right of FIG. 5A. For illustration, as shown at the right of FIG. 5A, word lines WL0-WL119 are arranged in a regular alternate order, as illustrated in FIG. 5A, thus the repetitious descriptions of the word lines W0-WL119 are not given here. For word lines WL120-WL127, instead of following the regular alternate order to be arranged in the first subgroup, the word lines WL120-WL127 are arranged in the second subgroup.

In addition, the rest word lines in the first groups of word lines 516a and in the second groups of word lines 516b at the left of FIG. 5A are arranged with the same word line scramble policy. Therefore, the repetitious descriptions are omitted here.

Figure 5B:
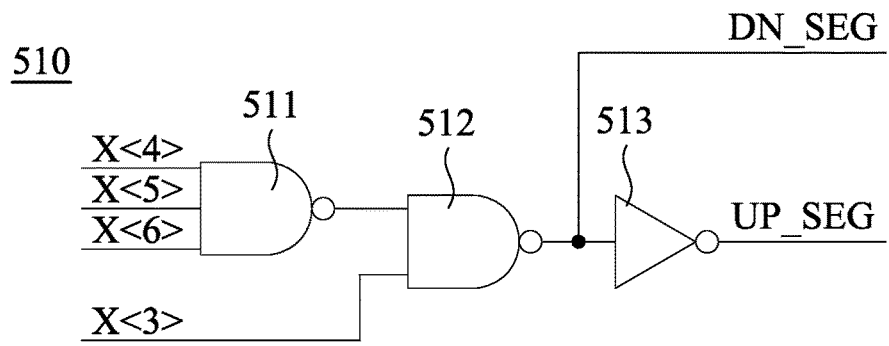
FIG. 5B is a circuit diagram of a decoder circuit corresponding to the decoder circuit of FIG. 1, in accordance with some embodiments of the present disclosure.

Reference is now made to FIG. 5B. FIG. 5B is a circuit diagram of a decoder circuit 510 corresponding to the decoder circuit 130 of FIG. 1, in accordance with some embodiments of the present disclosure. In some embodiments, the decoder circuit 510 is configured with respect to, for example, the decoder circuit 130 of FIG. 1. For illustration, the decoder circuit 510 includes NAND gates 511-512, and an inverter 513. An output of the NAND 511 is coupled to an input of the NAND gate 512. An output of the NAND gate 512 is coupled to an input of the inverter 513.

The NAND gates 511-512 are configured to receive the signal X with the aforementioned word line address including, for example, 000000000, and configured to perform logic operations of the bit data of the word line address, including, for example, the bit X<3>, the bit X<4>, the bit X<5>, and bit X<6>, of the signal X. The NAND gate 511 is configured to perform a NAND operation with the bit X<4>, the bit X<5>, and the bit X<6> in order to output a signal to the NAND gate 512. The NAND gate 512 is configured to perform a NAND operation with the bit X<3> and the signal received from the NAND gate 511 to output another signal as the control signal DN_SEG. The inverter 513 is configured to invert the signal received from the NAND gate 512 and to output a signal as the control signal UP_SEG.

Reference is now made to FIGS. 5A and 5B. In some embodiments, when the bit X<3> has a value of 0 with the bit X<4>, the bit X<5>, and the bit X<6> having a value of 0 or 1, one of the word lines WL0-WL7, WL16-WL23, WL32-WL39, WL48-WL55, WL64-WL71, WL80-WL87, WL88-WL95, WL96-WL103, WL112-119 is activated to turn on a corresponding memory cell on the array of memory cells 115 of FIG. 1. Further, the decoder circuit 510 generates the control signal DN_SEG having a value of 1 and the control signal UP_SEG having a value of 0, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLD and DLBD, and senses the data stored in the array of memory cells 115.

Similarly, when the bit X<3>, the bit X<4>, the bit X<5>, and bit X<6> have values of 1, one of the word lines WL120-WL127 is activated to turn on a corresponding memory cell on the array of memory cells 115 of FIG. 1. The operations of the decoder circuit 510, the converter circuit 140, and the access circuit 120 are similar with the operations illustrated in the embodiments of the bit X<3> having a value of 0 with the bit X<4>, the bit X<5>, and the bit X<6> having value of a 0 or 1, and the repetitious descriptions are thus not given here.

In various embodiments, when the bit X<3> has a value of 1 and the bit X<6> has a value of 0 with the bit X<4> and the bit X<5> having a value of 0 or 1, one of the word lines WL8-WL15, WL24-WL31, WL40-WL47, and WL56-WL63 is activated to turn on a corresponding memory cell on the array of memory cells 114 of FIG. 1. Further, the decoder circuit 510 generates the control signal DN_SEG having a value of 0 and the control signal UP_SEG having a value of 1, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLU, DLBU, FD, and FBD, and senses the data stored in the array of memory cells 114.

Similarly, when the bit X<3> has a value of 1 and the bit X<5> has a value of 0 with the bit X<4> and the bit X<6> having a value of 0 or 1, one of the word lines WL72-WL79, and WL88-WL95 is activated to turn on a corresponding memory cell on the array of memory cells 114 of FIG. 1. The operations of the decoder circuit 510, the converter circuit 140, and the access circuit 120 are similar with the operations illustrated in the embodiments of the bit X<3> having a value of 1 and the bit X<6> having a value of 0 with the bit X<4> and the bit X<5> having value of a 0 or 1, and the repetitious descriptions are thus not given here.

Moreover, when the bit X<3> has a value of 1 and the bit X<4> has a value of 0 with the bit X<5> and the bit X<6> having a value of 0 or 1, one of the word lines WL104-WL111 is activated to turn on a corresponding memory cell on the array of memory cells 114 of FIG. 1. The operations of the decoder circuit 510, the converter circuit 140, and the access circuit 120 are similar with the operations illustrated in the embodiments of the bit X<3> having a value of 1 and the bit X<6> having a value of 0 with the bit X<4> and the bit X<5> having value of a 0 or 1, and the repetitious descriptions are thus not given here.

In addition, the operations of the rest word lines, according to the word line address, in the word lines 516 at the left of FIG. 5A are similar with the operations of the word lines circled by the dash line in the word lines 516. The repetitious descriptions are thus omitted here.

Based on the above discussion with respect to FIGS. 5A-5B above, the determination of the configurations of the decoder circuit 510 is similar to that of the decoder circuit 310 as discussed above. Therefore, detailed descriptions are omitted for sake of brevity.

The implements of FIGS. 5A and 5B are given for illustrative purposes. Various implementations of the word lines 516 and the decoder circuit 510 are within the contemplated scope of the present disclosure. For example, in some embodiments, instead of arranging the word lines WL120-WL127 in the second subgroup, other word lines except WL120-WL127, including, for example, WL56-WL63, are arranged in the second subgroup, along with the adjustment to the configurations of decoder circuit 510.

Figure 6A:
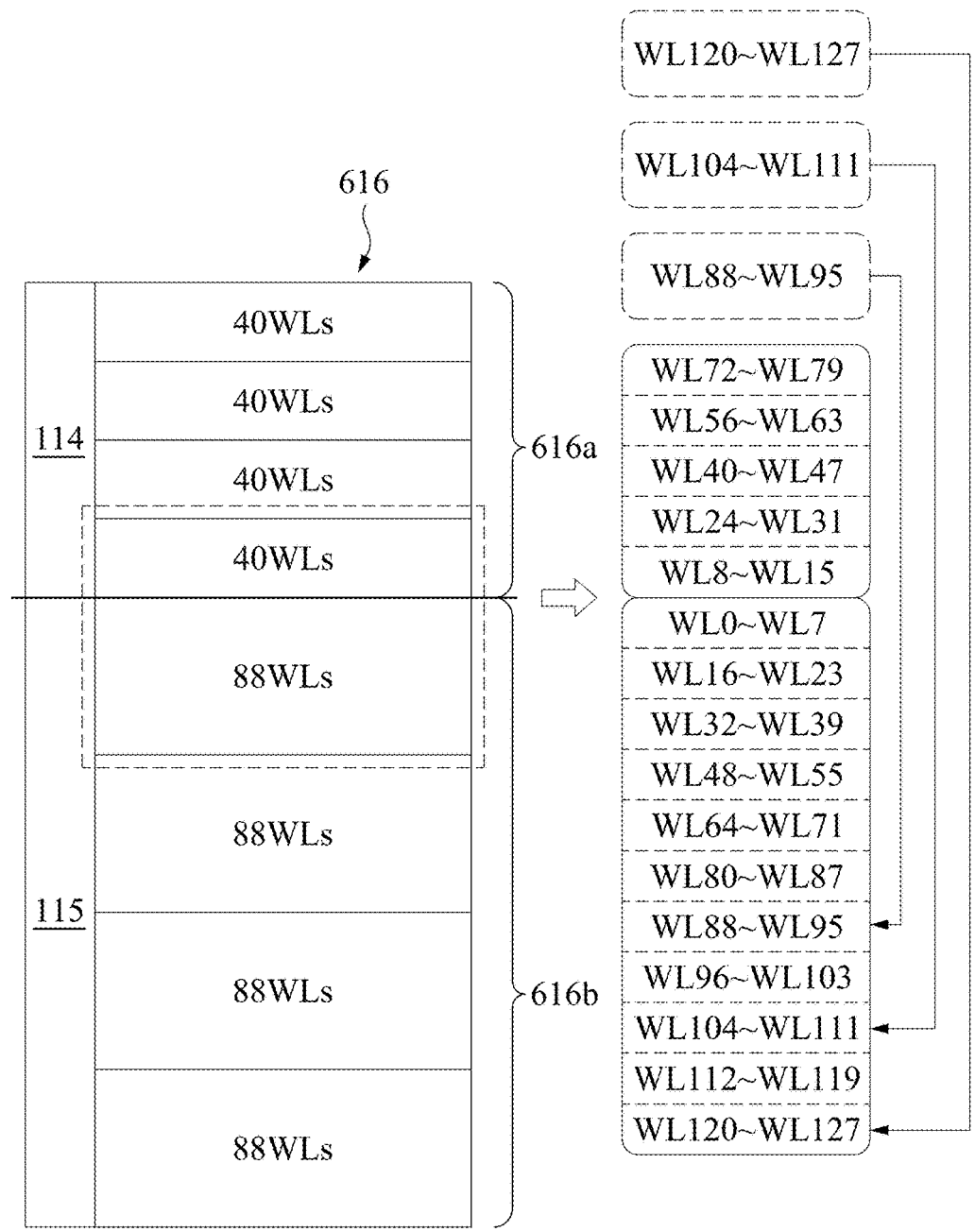
FIG. 6A is a schematic diagram of word lines of the integrated circuit of FIG. 1, in accordance with another embodiments of the present disclosure.

Reference is now made to FIG. 6A. FIG. 6A is a schematic diagram of word lines 616 of the integrated circuit 100 of FIG. 1, in accordance with another embodiment of the present disclosure.

Compared with the configurations of FIG. 3A, instead of including the word lines 116, as shown at the left of FIG. 6A, the integrated circuit 100 further includes multiple word lines 616. The word lines 616 include a first group of word lines 616a and a second group of word lines 616b. In some embodiments, the first group of word lines 616a are disposed in the segment 111 of FIG. 1, and the second group of word lines 616b are disposed between the segment 111 and the sense amplifier 123 of FIG. 1.

In some embodiments, the first group of word lines 616a are coupled to the array of memory cells 114 of FIG. 1, and the second group of word lines 616b are coupled to the array of memory cells 115 of FIG. 1. The operations of the first group of word lines 616a and the second group of word lines 616b are similar with the first group of word lines 116a and the second group of word lines 116b of FIG. 4A, and the repetitious descriptions are thus not given here.

For illustration, in the embodiments at the left of FIG. 6A, the first group of word lines 616a and the second group of word lines 616b are arranged according to a predetermined ratio that is about 5/11. In some embodiments, the first group of word lines 616a include, for example, 160 word lines, and the second group of word lines 616b include, for example, 352 word lines. Alternatively stated, a number of the first group of word lines 616a is smaller than a number of second group of word lines 616b.

As shown at the left of FIG. 6A, the first group of word lines 616a include multiple first subgroups, and the second group of word lines 616b include multiple second subgroups. In some embodiments, each one of the first subgroup includes, for example, 40 word lines, and each one of the second subgroup includes, for example, 88 word lines.

In some embodiments, the order of the word lines 616 is embodied by a word line scramble policy. For example, in a portion of the word lines 616 circled by dash line as shown at the left of FIG. 6A, 128 word lines included in one subgroup of the first subgroups and in an adjacent one of the second subgroups are taken as example for illustration at the right of FIG. 6A. For illustration, as shown at the right of FIG. 6A, word lines WL0-WL87 are arranged in a regular alternate order, as illustrated in FIG. 6A, thus the repetitious descriptions of the word lines WL0-WL87 are not given here. For word lines WL88-WL95, WL104-WL111, and WL120-127, instead of following the regular alternate order to be arranged in the first subgroup, the word lines WL88-WL95, WL104-WL111, and WL120-WL127 are arranged in the second subgroup.

In addition, the rest word lines in the first groups of word lines 616a and in the second groups of word lines 616b at the left of FIG. 6A are arranged with the same word line scramble policy. Therefore, the repetitious descriptions are omitted here.

Figure 6B:
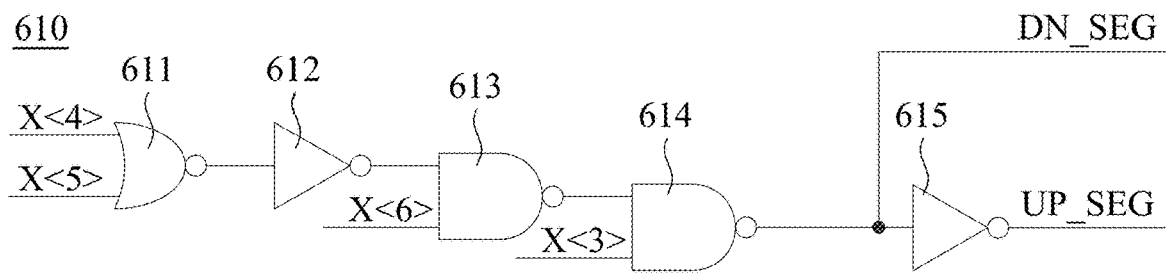
FIG. 6B is a circuit diagram of a decoder circuit corresponding to the decoder circuit of FIG. 1, in accordance with some embodiments of the present disclosure.

Reference is now made to FIG. 6B. FIG. 6B is a circuit diagram of a decoder circuit 610 corresponding to the decoder circuit 130 of FIG. 1, in accordance with some embodiments of the present disclosure. In some embodiments, the decoder circuit 610 is configured with respect to, for example, the decoder circuit 130 of FIG. 1. For illustration, the decoder circuit 610 includes a NOR gate 611, an inverter 612, NAND gates 613-614, and an inverter 615. An output of the NOR gate 611 is coupled to an input of the inverter 612. An output of the inverter 612 is coupled to one of inputs of the NAND gate 613. An output of the NAND gate 613 is coupled to one of inputs of the NAND gate 614. An output of the NAND gate 614 is coupled to an input of the inverter 615.

The NOR gate 611, the NAND gate 613, and the NAND gate 614 are configured to receive the signal X with the aforementioned word line address including, for example, 000000000, and configured to perform logic operations of the bit data of the word line address, including, for example, the bit X<3>, the bit X<4>, the bit X<5>, and bit X<6>, of the signal X. The NOR gate 611 is configured to perform a NOR operation with the bit X<4> and the bit X<5> in order to output a signal to the inverter 612. The inverter 612 is configured to invert the signal received from the NOR gate 611. The NAND gate 613 is configured to perform a NAND operation with the bit X<6> and the signal received from the inverter 612 to output another signal to the NAND gate 614. The NAND gate 614 is configured to perform a NAND operation with the bit X<3> and the another signal received from the NAND gate 613 to output other signal as the control signal DN_SEG. The inverter 615 is configured to invert the other signal received from the NAND gate 614 and to output a signal as the control signal UP_SEG.

Reference is now made to FIGS. 6A and 6B. In some embodiments, when the bit X<3> has a value of 0 with the bit X<4>, the bit X<5>, and the bit X<6> having a value of 0 or 1, one of the word lines WL0-WL7, WL16-WL23, WL32-WL39, WL48-WL55, WL64-WL71, WL80-WL87, WL88-WL95, WL96-WL103, WL112-119 is activated to turn on a corresponding memory cell on the array of memory cells 115 of FIG. 1. Further, the decoder circuit 610 generates the control signal DN_SEG having a value of 1 and the control signal UP_SEG having a value of 0, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLD and DLBD, and senses the data stored in the array of memory cells 115.

Similarly, when the bit X<3>, the bit X<5>, and bit X<6> have values of 1 with the bit X<4> having a value of 0 or 1, one of the word lines WL104-WL111, and WL120-WL127 is activated to turn on a corresponding memory cell on the array of memory cells 115 of FIG. 1. The operations of the decoder circuit 610, the converter circuit 140, and the access circuit 120 are similar with the operations illustrated in the embodiments of the bit X<3> having a value of 0 with the bit X<4>, the bit X<5>, and the bit X<6> having value of a 0 or 1, and the repetitious descriptions are thus not given here.

Moreover, when the bit X<3>, the bit X<4>, and bit X<6> have values of 1 with the bit X<5> having a value of 0, one of the word lines WL88-WL95 is activated to turn on a corresponding memory cell on the array of memory cells 115 of FIG. 1. The operations of the decoder circuit 610, the converter circuit 140, and the access circuit 120 are similar with the operations illustrated in the embodiments of the bit X<3> having a value of 0 with the bit X<4>, the bit X<5>, and the bit X<6> having value of a 0 or 1, and the repetitious descriptions are thus not given here.

In various embodiments, when the bit X<3> has a value of 1 and the bit X<6> has a value of 0 with the bit X<4> and the bit X<5> having a value of 0 or 1, one of the word lines WL8-WL15, WL24-WL31, WL40-WL47, and WL56-WL63 is activated to turn on a corresponding memory cell on the array of memory cells 114 of FIG. 1. Further, the decoder circuit 610 generates the control signal DN_SEG having a value of 0 and the control signal UP_SEG having a value of 1, and transmits the control signals DN_SEG and UP_SEG to the converter circuit 140 for further operations. As the configurations of FIG. 1 and FIG. 2 discussed above, the access circuit 120 accordingly precharges the pair of complementary data lines DLU, DLBU, FD, and FBD, and senses the data stored in the array of memory cells 114.

Similarly, when the bit X<3> and the bit X<6> have value of 1 with the bit X<4> and the bit X<5> having values of 0, one of the word lines WL72-WL79 is activated to turn on a corresponding memory cell on the array of memory cells 114 of FIG. 1. The operations of the decoder circuit 610, the converter circuit 140, and the access circuit 120 are similar with the operations illustrated in the embodiments of the bit X<3> having a value of 1 and the bit X<6> having a value of 0 with the bit X<4> and the bit X<5> having value of a 0 or 1, and the repetitious descriptions are thus not given here.

In addition, the operations of the rest word lines, according to the word line address, in the word lines 616 at the left of FIG. 6A are similar with the operations of the word lines circled by the dash line in the word lines 616. The repetitious descriptions are thus omitted here.

Based on above discussion with respect to FIGS. 6A-6B, the determination of the configurations of the decoder circuit 610 is similar to that of the decoder circuit 310 as discussed above. Therefore, detailed descriptions are omitted for sake of brevity.

The implements of FIGS. 6A-6B are given for illustrative purposes. Various implementations of the word lines 616 and the decoder circuit 610 are within the contemplated scope of the present disclosure. For example, in some embodiments, instead of arranging the word lines WL120-WL127 in the second subgroup, other word lines except WL120-WL127, including, for example, WL64-WL71, are arranged in the second subgroup, along with the adjustment to the configurations of decoder circuit 610.

As discussed above, with reference to FIGS. 3A-6B, in some embodiments, the configurations of the decoder circuit 310, 410, 510, and 610 is associated with the predetermined ratio of the number of the array of memory cells 114 to the number of the array of memory cells 115, and/or associated with the predetermined ratio of the number of rows of memory cells in the array of memory cells 114 to the number of rows of memory cells in the array of memory cells 115. Alternatively stated, various implements of the predetermined ratios as discussed above correspond to various configurations of the decoder circuits configured with respect to the decoder circuit 130 of FIG. 1.

In addition, with continuous reference to FIGS. 3A-6B, in some embodiments, the arrangements of the order of the word lines 116, 316, 416, 516, and 616 are associated with the predetermined ratio of the number of the array of memory cells 114 to the number of the array of memory cells 115, and/or associated with the predetermined ratio of the number of rows of memory cells in the array of memory cells 114 to the number of rows of memory cells in the array of memory cells 115 as well. Accordingly, in such embodiments, coding for the word line address corresponding to the word lines is associated with the predetermined ratios as discussed above.

Figure 7:
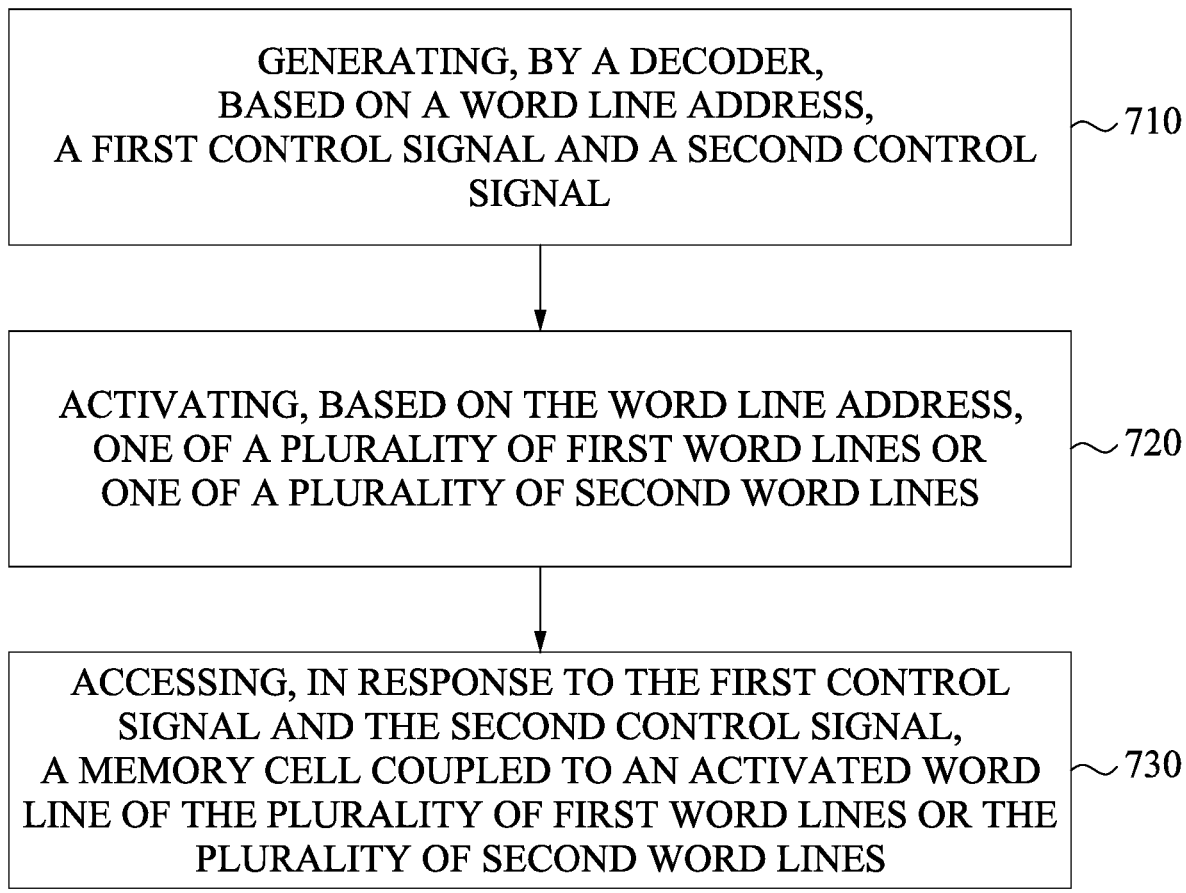
FIG. 7 is a flowchart of a method, in accordance with some embodiments of the present disclosure.

Reference is now made to FIG. 7. FIG. 7 is a flowchart of a method 700 for operating an integrated circuit, in accordance with some embodiments of the present disclosure. In some embodiments, the integrated circuit 100 of FIG. 1 is operated, based on the method 700, with the embodiments illustrated in conjunctions with FIGS. 3A-6B. Other methods for operating the integrated circuit based on the integrated circuit 100 illustrated in conjunctions with FIGS. 3A-6B are within the contemplated scope of the present disclosure. The method 700 includes operations S710-S730 that are described below with reference to FIGS. 1 and 3.

The method 700 includes exemplary operations as follows, but the operations of the method 700 are not necessarily performed in the order described. The order of the operations disclosed in the method 700 are able to be changed, or the operations are able to be executed simultaneously or partially simultaneously as appropriate, in accordance with the spirit and scope of various embodiments of the present disclosure. Furthermore, additional operations may be performed before, during, and/or after the method 700, and some other operations may only be briefly described herein.

In operation 710, a first control signal DN_SEG and a second control signal UP_SEG are generated, based on a word line address, by the decoder circuit 310.

In some embodiments, the operation 710 of generating the first control signal DN_SEG and the second control signal UP_SEG includes performing a OR logic operation with the word line address and outputting at least one logic signal as the first control signal DN_SEG and inverting, by the inverter 313, the logic signal to output an inverted logic signal as the second control signal UP_SEG.

In operation 720, based on the word line address, one of first word lines, for example, the first group of word lines 116a, or one of second word lines, for example, the second group of word lines 116b, are activated.

In some embodiments, the method 700 further includes the operations of arranging alternatively the order of the first group of word lines 116a and the second group of word lines 116b and rearranging part of the plurality of first word lines to be part of the plurality of second word lines. For example, in the embodiments as illustrated in FIG. 3A, the word lines WL40-WL47 and WL56-63 are originally arranged in the first group of word lines 116a, and later, the word lines WL40-WL47 and WL56-63 are rearranged in the second group of word lines 116b.

In operation 730, a memory cell in the array of memory cells 114 or the array of memory cells 115, coupled to an activated word line of the first group of word lines 116a, or the second group of word lines 116b, is accessed in response to the first control signal DN_SEG and the second control signal UP_SEG.

In some embodiments, the first control signal DN_SEG and the second control signal UP_SEG are associated with a predetermined ratio of a number of the first word lines to a number of the second word lines. For example, as the word line address being, for example, 000101000 (corresponding to the word line WL40), when the predetermined ratio of a number of the first word lines to a number of the second word lines of FIG. 3A is 1/3, the first control signal DN_SEG has a value of 1 and the second control signal UP_SEG has a value of 0. However, in various embodiments, with reference to FIG. 4A, when the predetermined ratio of a number of the first word lines to a number of the second word lines is 3/5, the first control signal DN_SEG has a value of 0 and the second control signal UP_SEG has a value of 1.

In some embodiments, the predetermined ratio of a number of the first word lines to a number of the second word lines is less than 1. For example, as the embodiments discussed in the FIGS. 3A-6B, the predetermined ratio is 1/3, 3/5, 7/9, 5/11.

Furthermore, in some approaches, a number of the memory cells coupled to, for example, the pairs of complementary data lines DLU, DLBU, FD, and FDB, and a number of memory cells coupled to, for example, the pairs of complementary data lines DLD and DLBD, are the same. The writing speed of the pairs of complementary data lines DLU, DLBU, FD, and FDB is much lower than the writing speed of the pairs of complementary data lines DLD and DLBD. In such approaches, the writing speed of the integrated circuit is dominated by the writing speed of the pairs of complementary data lines DLU, DLBU, FD, and FDB.

Compared to some approaches, the integrated circuit, with the configurations as illustrated in the embodiments of FIGS. 1-6B, provides balanced speed of writing data with the pairs of complementary data lines DLU, DLBU, FD, FDB and with the pairs of complementary data lines DLD and DLBD. For example, in some embodiments, the ratio of the number of rows of memory cells coupled to the pairs of complementary data lines DLU, DLBU, FD to the number of rows of memory cells coupled to the pairs of complementary data lines DLD and DLBD is about 3/5. The writing speed of the pairs of complementary data lines DLU, DLBU, FD, and FDB is improved and approximately the same as the writing speed of the pairs of complementary data lines DLD and DLBD. Accordingly, the integrated circuit provides better and more stable writing speed, compared with some approaches.

As described above, the integrated circuit in the present disclosure provides asymmetric arrangements of two memory cells arrays, having different numbers of cells, that are coupled to two asymmetric pairs of data lines. By balancing the RC loads of the two pairs of data lines, the integrated circuit provides balanced access speeds and active powers during read/write operation.

In some embodiments, an integrated circuit is disclosed. The integrated circuit includes a first array of memory cells, a second array of memory cells, a first pair of complementary data lines, a second pair of complementary data lines, and a third pair of complementary data lines. The first pair of complementary data lines extend along the first array of memory cells and terminating between the first array of memory cells and the second array of memory cells. The first pair of complementary data lines are coupled to the first array of memory cells. The second pair of complementary data lines extend along the second array of memory cells. The second pair of complementary data lines are coupled to the first pair of complementary data lines. The third pair of complementary data lines extend along the second array of memory cells. The third pair of complementary data lines are coupled to the second array of memory cells. A number of rows of memory cells in the first array of memory cells is different from a number of rows of memory cells in the second array of memory cells. In some embodiments, the number of rows of memory cells in the first array of memory cells is smaller than the number of rows of memory cells in the second array of memory cells. In some embodiments, lengths of the first pair of complementary data lines are different from lengths of the second pair of complementary data lines. In some embodiments, lengths of the first pair of complementary data lines are shorter than lengths of the third pair of complementary data lines. In some embodiments, the integrated circuit further includes a plurality of word lines. The plurality of word lines include a first group of word lines coupled to the first array of memory cells and a second group of word lines coupled to the second array of memory cells. The number of the first group of word lines is smaller than a number of the second group of word lines. In some embodiments, the integrated circuit further includes a selector circuit coupled to the second pair of complementary data lines and the third pair of complementary data lines. The selector circuit is configured to select, in response to a first control signal and a second control signal, the first array of memory cells or the second array of memory cells to be coupled to a sense amplifier. In some embodiments, the integrated circuit further includes a decoder circuit configured to generate, based on a word line address, a first control signal and a second control signal. Data stored in a portion of the first array of memory cells or data stored in a portion of the second array of memory cells are configured to be accessed according to the first control signal and the second control signal. In some embodiments, the integrated circuit further includes an access circuit. The access circuit includes a precharge circuit. The precharge circuit is coupled to the second pair of complementary data lines and the third pair of complementary data lines, and and configured to precharge, according to an word line address, the firs pair of complementary data lines coupled with the the second pair of complementary data lines, and the the second pair of complementary data lines or the third pair of complementary data lines. The integrated circuit further includes a selector circuit. The selector circuit is configured to selectively pass, in response to the word line address, signals from the first pair of complementary data lines through the second pair of complementary data lines to a sense amplifier, or signals from the third pair of complementary data lines to the sense amplifier.

Also disclosed is an integrated circuit that includes a plurality of memory cells, a first pair of complementary data lines, a second pair of complementary data lines, a plurality of first word lines, and a plurality of second word lines. The plurality of memory cells includes a first array of memory cells and a second array of memory cells. The first pair of complementary data lines are coupled to the first array of memory cells. The second pair of complementary data lines are coupled to the second array of memory cells. The plurality of first word lines are arranged in a first segment of a memory bank, and coupled to the first array of memory cells. The plurality of second word lines are arranged in a second segment, of the memory bank, that is disposed between the first segment and a sense amplifier, and the plurality of second word lines being coupled to the second array of memory cells. Lengths of the first pair of complementary data lines are shorter than lengths of the second pair of complementary data lines. The plurality of first word lines and the plurality of second word lines are arranged according to a predetermined ratio of a number of the plurality of first word lines to a number of the plurality of second word lines. The predetermined ratio is less than 1. In some embodiments, the predetermined ratio is substantially 1/3, 3/5, 7/9, 5/11 or 3/13. In some embodiments, the plurality of first word lines and the plurality of second word lines are configured to be activated according to a word line address. The word line address is associated with the predetermined ratio. In some embodiments, the second array of memory cells occupy a greater area than that occupied by the first array of memory cells in a plan view. In some embodiments, the integrated circuit further includes a third pair of complementary data lines coupled to the first pair of complementary data lines. L lengths of the third pair of complementary data lines are longer than lengths of the first pair of complementary data lines. In some embodiments, the first pair of complementary data lines and the second pair of complementary data lines are disposed in a first layer, and the third pair of complementary data lines are disposed in a second layer different from the first layer. In some embodiments, the integrated circuit further includes a strap cell disposed between the first segment and the second segment. The first array of memory cells and the second array of memory cells are disposed at opposite sides of the strap cell. A number of rows of memory cells in the first array of memory cells is different from a number of rows of memory cells in the second array of memory cells. In some embodiments, the integrated circuit further includes a decoder circuit and an access circuit. The decoder circuit is configured to generate, based on a word line address, a first control signal and a second control signal. The access circuit is configured to be enabled, in response to the first control signal and the second control signal, to sense data stored in the first array of memory cells or data stored in the second array of memory cells.

Also disclosed is a method that includes the operation below: generating, by a decoder circuit, based on a word line address, a first control signal and a second control signal; activating, based on the word line address, one of a plurality of first word lines or one of a plurality of second word lines; and accessing, in response to the first control signal and the second control signal, a memory cell coupled to an activated word line of the plurality of first word lines or the plurality of second word lines. The first control signal and the second control signal are associated with a predetermined ratio of a number of the plurality of first word lines to a number of the plurality of second word lines. In some embodiments, the predetermined ratio is less than 1. In some embodiments, the operation of generating the first control signal and the second control signal includes performing at least one logic operation with the word line address and outputting a logic signal as the first control signal and inverting, by an inverter, the logic signal to output an inverted logic signal as the second control signal. In some embodiments, the method further includes the operations of arranging alternatively the order of the plurality of first word lines and the plurality of second word lines and rearranging part of the plurality of first word lines to be part of the plurality of second word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first array of memory cells;
   a second array of memory cells;
   a first pair of complementary data lines extending along the first array of memory cells and terminating between the first array of memory cells and the second array of memory cells, wherein the first pair of complementary data lines are coupled to the first array of memory cells;
   a second pair of complementary data lines extending along the second array of memory cells, wherein the second pair of complementary data lines are coupled to the first pair of complementary data lines; and
   a third pair of complementary data lines extending along the second array of memory cells, wherein the third pair of complementary data lines are coupled to the second array of memory cells;
   wherein a number of rows of memory cells in the first array of memory cells is different from a number of rows of memory cells in the second array of memory cells.

2. The integrated circuit of claim 1, wherein the number of rows of memory cells in the first array of memory cells is smaller than the number of rows of memory cells in the second array of memory cells.

3. The integrated circuit of claim 1, wherein lengths of the first pair of complementary data lines are different from lengths of the second pair of complementary data lines.

4. The integrated circuit of claim 1, wherein lengths of the first pair of complementary data lines are shorter than lengths of the third pair of complementary data lines.

5. The integrated circuit of claim 1, further comprising:
   a plurality of word lines comprising:
      a first group of word lines coupled to the first array of memory cells; and
      a second group of word lines coupled to the second array of memory cells;
   wherein a number of the first group of word lines is smaller than a number of the second group of word lines.

6. The integrated circuit of claim 1, further comprising:
   a selector circuit coupled to the second pair of complementary data lines and the third pair of complementary data lines,
   wherein the selector circuit is configured to select, in response to a first control signal and a second control signal, the first array of memory cells or the second array of memory cells to be coupled to a sense amplifier.

7. The integrated circuit of claim 1, further comprising:
   a decoder circuit configured to generate, based on a word line address, a first control signal and a second control signal;
   wherein data stored in a portion of the first array of memory cells or data stored in a portion of the second array of memory cells are configured to be accessed according to the first control signal and the second control signal.

8. The integrated circuit of claim 1, further comprising:
   an access circuit, comprising:
      a precharge circuit coupled to the second pair of complementary data lines and the third pair of complementary data lines, and configured to precharge, according to a word line address, the first pair of complementary data lines coupled with the second pair of complementary data lines, and the second pair of complementary data lines or the third pair of complementary data lines; and
      a selector circuit configured to selectively pass, in response to the word line address, signals from the first pair of complementary data lines through the second pair of complementary data lines to a sense amplifier, or signals from the third pair of complementary data lines to the sense amplifier.

9. An integrated circuit, comprising:
a plurality of memory cells comprising a first array of memory cells in a first number of rows and a second array of memory cells in a second number of rows, wherein the first number of rows and the second number of rows are different from each other;
a first pair of complementary data lines coupled to the first array of memory cells;
a second pair of complementary data lines coupled to the second array of memory cells;
a plurality of first word lines arranged in a first segment of a memory bank, and coupled to the first array of memory cells; and
a plurality of second word lines arranged in a second segment of the memory bank, that is disposed between the first segment and a sense amplifier, and the plurality of second word lines being coupled to the second array of memory cells;
wherein lengths of the first pair of complementary data lines are shorter than lengths of the second pair of complementary data lines;
wherein the plurality of first word lines and the plurality of second word lines are arranged according to a predetermined ratio of a number of the plurality of first word lines to a number of the plurality of second word lines;
wherein the predetermined ratio is less than 1.

10. The integrated circuit of claim 9, wherein the predetermined ratio is substantially 1/3, 3/5, 7/9, 5/11 or 3/13.

11. The integrated circuit of claim 9, wherein
the plurality of first word lines and the plurality of second word lines are configured to be activated according to a word line address;
wherein the word line address is associated with the predetermined ratio.

12. The integrated circuit of claim 9, wherein the second array of memory cells occupy a greater area than that occupied by the first array of memory cells in a plan view.

13. The integrated circuit of claim 9, further comprising:
a third pair of complementary data lines coupled to the first pair of complementary data lines;
wherein lengths of the third pair of complementary data lines are longer than lengths of the first pair of complementary data lines.

14. The integrated circuit of claim 13, wherein
the first pair of complementary data lines and the second pair of complementary data lines are disposed in a first layer, and
the third pair of complementary data lines are disposed in a second layer different from the first layer.

15. The integrated circuit of claim 9, further comprising:
a strap cell disposed between the first segment and the second segment;
wherein the first array of memory cells and the second array of memory cells are disposed at opposite sides of the strap cell;
wherein a number of rows of memory cells in the first array of memory cells is different from a number of rows of memory cells in the second array of memory cells.

16. The integrated circuit of claim 9, further comprising:
a decoder circuit configured to generate, based on a word line address, a first control signal and a second control signal; and
an access circuit configured to be enabled, in response to the first control signal and the second control signal, to sense data stored in the first array of memory cells or data stored in the second array of memory cells.

17. A method, comprising:
generating, by a decoder circuit, based on a word line address, a first control signal and a second control signal;
activating, based on the word line address, one of a plurality of first word lines or one of a plurality of second word lines; and
accessing, in response to the first control signal and the second control signal, a memory cell coupled to an activated word line of the plurality of first word lines or the plurality of second word lines,
wherein the memory cell is in a first array of memory cells having a first number of rows or in a second array of memory cells having a second number of rows, wherein the first number of rows is smaller than the second number of rows;
wherein the first control signal and the second control signal are associated with a predetermined ratio of a number of the plurality of first word lines to a number of the plurality of second word lines.

18. The method of claim 17, wherein the predetermined ratio is less than 1.

19. The method of claim 17, wherein generating the first control signal and the second control signal comprises:
performing at least one logic operation with the word line address and outputting a logic signal as the first control signal; and
inverting, by an inverter, the logic signal to output an inverted logic signal as the second control signal.

20. The method of claim 17, further comprising:
arranging alternatively the order of the plurality of first word lines and the plurality of second word lines; and
rearranging part of the plurality of first word lines to be a part of the plurality of second word lines.

* * * * *